US011817365B2

(12) United States Patent
Patil et al.

(10) Patent No.: US 11,817,365 B2
(45) Date of Patent: Nov. 14, 2023

(54) THERMAL MITIGATION DIE USING BACK SIDE ETCH

(71) Applicant: QUALCOMM Incorporated, San Diego, CA (US)

(72) Inventors: Aniket Patil, San Diego, CA (US); Hong Bok We, San Diego, CA (US); Jonghae Kim, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 10 days.

(21) Appl. No.: 16/883,812

(22) Filed: May 26, 2020

(65) Prior Publication Data

US 2021/0375712 A1     Dec. 2, 2021

(51) Int. Cl.
| | |
|---|---|
| *H01L 23/367* | (2006.01) |
| *H01L 23/373* | (2006.01) |
| *H01L 21/3065* | (2006.01) |
| *H01L 21/48* | (2006.01) |
| *H01L 21/306* | (2006.01) |
| *H01L 21/322* | (2006.01) |

(52) U.S. Cl.
CPC ........ *H01L 23/367* (2013.01); *H01L 21/3065* (2013.01); *H01L 21/4882* (2013.01); *H01L 23/3736* (2013.01); *H01L 21/30604* (2013.01); *H01L 21/3221* (2013.01)

(58) Field of Classification Search
CPC ............... H01L 23/367; H01L 21/3065; H01L 21/4882; H01L 23/3736; H01L 23/42; H01L 21/3221; H01L 21/30604
See application file for complete search history.

(56) References Cited

U.S. PATENT DOCUMENTS

| | | | |
|---|---|---|---|
| 11,037,853 B1* | 6/2021 | Chan ....................... H01L 25/50 |
| 11,488,887 B1* | 11/2022 | Refai-Ahmed ......... H01L 23/36 |
| 2017/0092558 A1* | 3/2017 | Mittal ................. H01L 25/0657 |
| 2019/0198444 A1* | 6/2019 | Amanapu ......... H01L 21/76846 |
| 2019/0355642 A1* | 11/2019 | Brown .................... H01L 23/31 |
| 2021/0159117 A1* | 5/2021 | Wang .................. H01L 21/7684 |

* cited by examiner

Primary Examiner — Patricia D Valenzuela
(74) Attorney, Agent, or Firm — Seyfarth Shaw LLP

(57) ABSTRACT

A semiconductor device includes a die having one or more trenches on a back side of the die. The semiconductor device also includes a layer of thermally conductive material deposited on the back side of the die to fill the one or more trenches to form one or more plated trenches. The size (e.g., surface area or thickness (Z-height)) or location of the plated trenches may be determined based on one or more heat generating elements such as logic devices (CPU or GPU, for example) on an active side of the die. The thermally conductive material, which may be a metal such as copper (Cu) or silver (Ag), has a heat dissipation coefficient that is greater than a heat dissipation coefficient of a substrate of the die.

14 Claims, 6 Drawing Sheets

| | ILLUSTRATION OF DEVICE | METHOD |
|---|---|---|
| 302 | 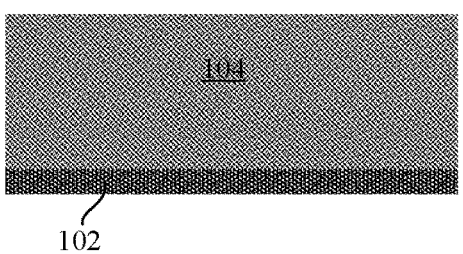 | Fabricate logic devices and interconnections on active side of die (FEOL + BEOL processes) |
| 304 | 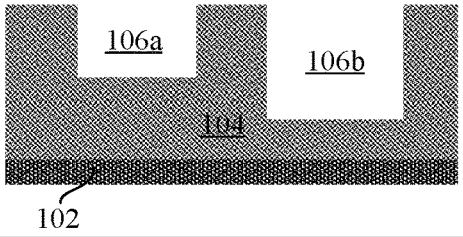 | Form trench(es) (e.g., plasma etching) on back side of die |
| 306 | 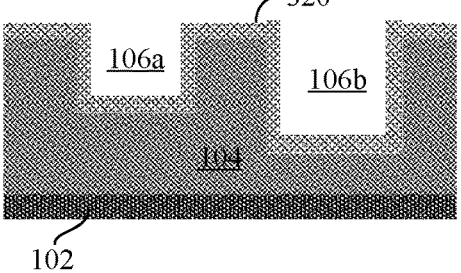 | Deposit seed layer on surface of the trench(es) |
| 308 | 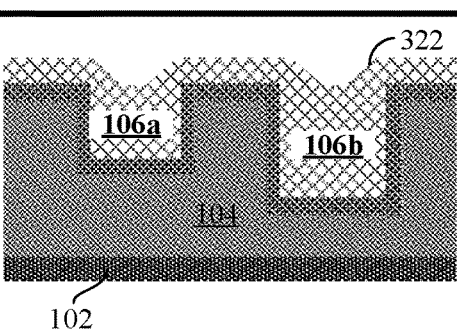 | Deposit thermally conductive material (e.g., metal or metal alloy plating) on seed layer |
| 310 | 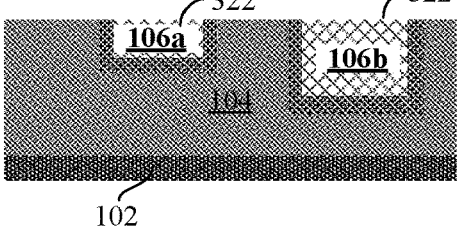 | Grind back thermally conductive material to thickness of substrate |

*FIG. 3*

THERMAL MITIGATION DIE USING BACK SIDE ETCH

TECHNICAL FIELD

The present disclosure generally relates to semiconductor devices. More specifically, the present disclosure relates to enhanced thermal mitigation in integrated circuits (ICs) using a trench etched in the back side of the IC and plated with a thermally conductive material.

BACKGROUND

Heat dissipation is increasingly problematic for high end chips. High-speed processors generate a significant amount of heat. Next generation processors are being designed on smaller and smaller silicon nodes. As a result, even more heat generation will occur at each node on the die (e.g., per $mm^2$). During logic operations, processor units may generate more heat than the rest of the die, which may create hotspots on silicon (Si) despite the fact that silicon (Si) is a good conductor of heat.

Additionally, some high end chips use die stacking, which may exacerbate the problem. In particular, stacking two or more chips may lead to localized thermal hot spots. As the localized thermal hot spots are embedded in the stack-up, this may reduce the ability to cool the hot spots and achieve low junction temperatures. Accordingly, processor performance may suffer.

SUMMARY

In an aspect of the present disclosure, a semiconductor device is provided. The semiconductor device includes a die having a trench on a back side of the die. The semiconductor device also includes a layer of thermally conductive material deposited on the back side of the die to fill the trench to form a plated trench. The thermally conductive material has a first heat dissipation coefficient and a substrate of the die has a second heat dissipation coefficient. The first heat dissipation coefficient is greater than the second heat dissipation coefficient.

In another aspect of the present disclosure, a method of fabricating a semiconductor device is provided. The method includes etching a trench in a back side of a die. The method also includes depositing thermally conductive material on the back side of the die to fill the trench forming a plated trench. The thermally conductive material has a first heat dissipation coefficient and a substrate of the die has a second heat dissipation coefficient. The first heat dissipation coefficient is greater than the second heat dissipation coefficient.

In a further aspect of the present disclosure, an apparatus is provided. The apparatus includes an integrated circuit package. The integrated circuit package includes a die having a heat generating element on an active side of the die. The integrated circuit package also includes a trench on a back side of the die. The trench is filled with a thermally conductive material to form a plated trench. The die is mounted on a package substrate. The thermally conductive material has a first heat dissipation coefficient and a substrate of the die has a second heat dissipation coefficient. The first heat dissipation coefficient is greater than the second heat dissipation coefficient.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIG. 3 is a diagram illustrating a process for forming a semiconductor device, such as the semiconductor device of FIG. 1, in accordance with aspects of the present disclosure.

DETAILED DESCRIPTION

Various aspects of the present disclosure provide techniques to mitigate problems relating to heat dissipation within an integrated circuit package formed by through-silicon stacking (TSS), package-on-package (PoP), or other like techniques involving die or package stacking. In accordance with aspects of the present disclosure, an integrated circuit or die may have one or more trenches etched on the back side of the die. These trenches may then be plated and filled with a more thermally conductive material than the removed substrate (e.g., silicon (Si)). Thermal conductivity is a measure of the ability of a material to conduct heat.

By replacing the removed substrate with a more thermally conductive material, heat generated by operation of logic elements on the active side of the die may more quickly pass through the back side of the die. That is, the Z height distance between the heat generating logic on the active side of the die and the atmosphere may be reduced. As such, heat dissipation may be improved thereby improving thermal performance of a local region that was previously affected by excessive heat, such as a hotspot.

Figure 1:
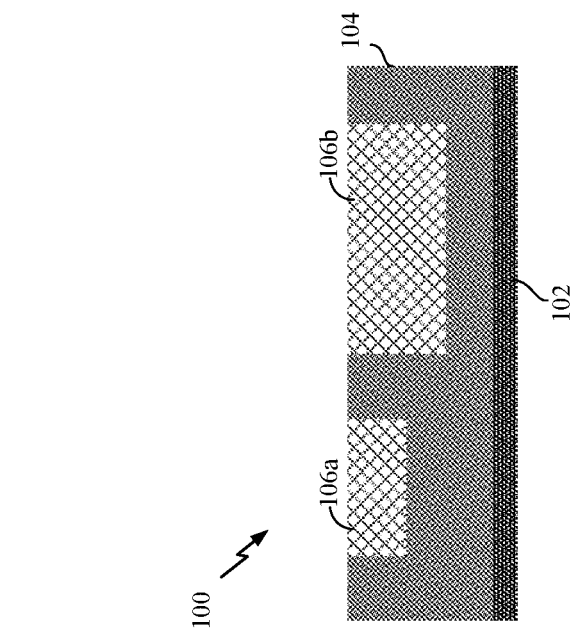
FIG. 1 is a diagram illustrating a cross-sectional view of a semiconductor device, in accordance with aspects of the present disclosure.

FIG. 1 is a diagram illustrating a cross-sectional view of a semiconductor device 100, in accordance with aspects of the present disclosure. As shown in FIG. 1, the semiconductor device 100, which may be a die or integrated circuit device, may be composed of a substrate such as silicon (Si), for example. The semiconductor device 100 may include an active side 102 and a back side 104. The active side 102 includes front-end-of-line (FEOL) processing and back-end-of-line (BEOL) processing. The FEOL processing includes the formation of logic devices such as transistors on the semiconductor device 100. During the BEOL processing, interconnections between the logic devices may be produced.

The back side 104 of the semiconductor device 100 includes one or more trenches 106a and 106b. The trenches 106a and 106b may be produced on the back side 104 of the semiconductor device 100 using an etch process, such as plasma (dry) etch processing or wet etch processing, or other processes for creating a trench. The size of the trench (e.g., 106a and/or 106b) and the location or position of the trench may be determined based on heat generating elements included on the active side 102 of the semiconductor device 100. The heat generating element may be any logic element (e.g., a central processing unit (CPU) or a graphics processing unit (GPU)) on the active side 102 that when operated produces heat. In one example, each trench (e.g., 106a or 106b) may be positioned at a corresponding location of the back side 104 opposite a heat generating element on the active side 102 of the semiconductor device 100. The trenches may have the same or different size (e.g., dimensions such as the surface area, or Z-height, which may be referred to as depth). For instance, the trench 106a may be larger (e.g., cover a larger surface area or greater depth) than the trench 106b. In a second example, the trench 106b may be configured larger when it is opposite a CPU, or smaller when it is positioned opposite a multimedia logic device.

Each of the trenches (e.g., 106a, 106b) may be filled or plated with a thermally conductive material. In some aspects, the thermally conductive material may have a greater heat dissipation coefficient than that of the substrate of the semiconductor device 100. The heat dissipation coefficient may be the amount of heat lost for each 1° C. difference in temperature between a hot body and its surroundings in a unit of time. For instance, in one example, where the semiconductor device 100 is composed of silicon (Si), the thermally conductive material may be a metal such as copper (Cu) or silver (Ag). In some aspects, the type of thermally conductive material (for example, copper (Cu), silver (Ag), or other metal or metal alloy) may be determined based on the type of heat generating element or temperature profile thereof on the active side 102 of the semiconductor device 100. The temperature profile for a heat generating element may include operating temperature at a certain frequency, anticipated utilization, maximum operating temperature, or other metric, for example. By replacing the substrate removed (for example, via an etch process) with a thermally conductive material with a greater heat dissipation coefficient, heat generated by the logic device on the active side of the semiconductor device 100 may be more quickly dissipated into the atmosphere via the thermally conductive material than would have been dissipated via the substrate. In doing so, the operating temperature of a logic device on the active side 102 of the semiconductor device 100 may be reduced. Furthermore, by providing such thermal mitigation, the performance of the logic devices included on the active side 102 of the semiconductor device 100 may be improved and the logic devices, the semiconductor device 100, and any device using the semiconductor device 100 may be protected.

Figure 2:
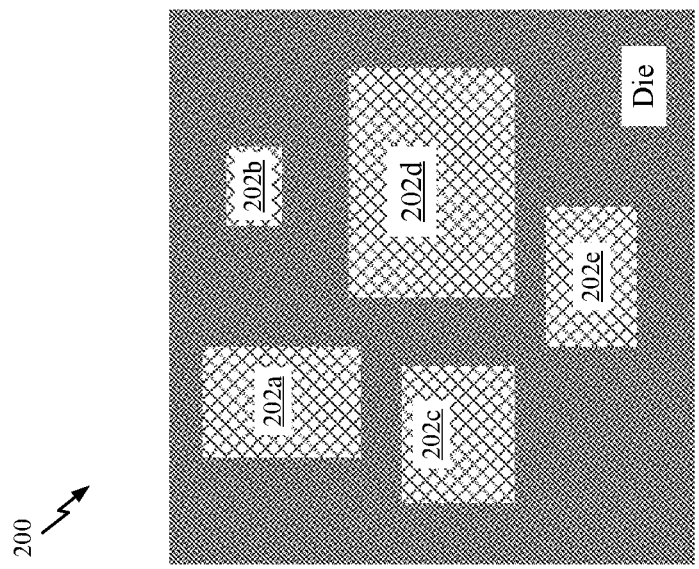
FIG. 2 is a diagram illustrating a top view of a semiconductor device, in accordance with aspects of the present disclosure.

FIG. 2 is a diagram illustrating a top view of a semiconductor device 200, in accordance with aspects of the present disclosure. Referring to FIG. 2, the semiconductor device 200 may be a die or an integrated circuit (IC) and may be composed of silicon (Si), for example. The semiconductor device 200 may include multiple etched regions 202a-202e. Each of the etched regions 202a-202e may be a trench. Each such trench may be filled or plated with a thermally conductive material to improve dissipation of heat from a heat generating element or component included in the active side (not shown) of the semiconductor device 200. In some aspects, the thermally conductive material may be a metal, such as copper (Cu) or silver (Ag), for instance. However, the present disclosure is not so limiting, and instead the thermally conductive material may be a different material having a greater heat dissipation coefficient than the substrate, e.g., silicon (Si). In one example, the etched regions 202a-202e, may be filled with cooper (Cu), which is more thermally conductive than silicon (Si).

FIG. 3 is a diagram illustrating a process for forming a semiconductor device 300, such as the semiconductor device 100 of FIG. 1, in accordance with aspects of the present disclosure. At block 302, FEOL and BEOL processes are conducted to fabricate transistors and other logic devices, as well as interconnections on the active side 102 of the device. At block 304, one or more trenches (e.g., 106a and 106b) are produced on the back side 104 of the device. The trench(es) (e.g., 106a and 106b) may be produced by applying an etch process, such as plasma etching or other process to the back side 104 of the device, for instance. The location of the trench(es) may be determined based on the heat generating elements on the active side 102 of the device. In one example, the trench (e.g., 106a) may be positioned at a corresponding position opposite a heat generating element on the active side (102) of the device. In a second example, one or more trenches (e.g., 106a and 106b) may be positioned at locations based on anticipated hotspots or points at which excessive operating temperatures may be reached (including between heat generating elements). Additionally, the size (e.g., surface area or depth) of the trench (e.g., 106a) may be determined based on the heat generating element on the active side 102 of the device.

At block 306, a seed layer 320 may be deposited on the surface of the trench(es) (e.g., 106a and 106b). For example, the seed layer 320 may comprise titanium-copper (TiCu), titanium-tungsten (TiW), copper (Cu), or the like. The seed layer 320 may be deposited using a physical vapor technique, for instance.

At block 308, a thermally conductive material 322 may be layered over the seed layer 320 to plate or fill the trench(es) (e.g., 106a and 106b) forming a plated trench(es). The thermally conductive material 322 may have a greater heat dissipation coefficient than that of the substrate of the device (e.g., back side 104). For example, the thermally conductive material 322 may be a metal such as copper (Cu), silver (Ag), or a metal alloy. Additionally, in some aspects, the thermally conductive material 322 may be determined or selected based on heat generating elements on the active side 102 of the device or the temperature profile. In one example, where the heat generating element is a GPU, copper (Cu) may be selected as the thermally conductive material 322, and where the heat generating element is a multimedia device, a metal alloy may be selected as the thermally conductive material 322.

At block 310, the excess thermally conductive material 322 (for example copper (Cu)) may be grinded back to the thickness of the substrate of the device (e.g., back side 104) via a suitable backgrinding process.

Figure 4:
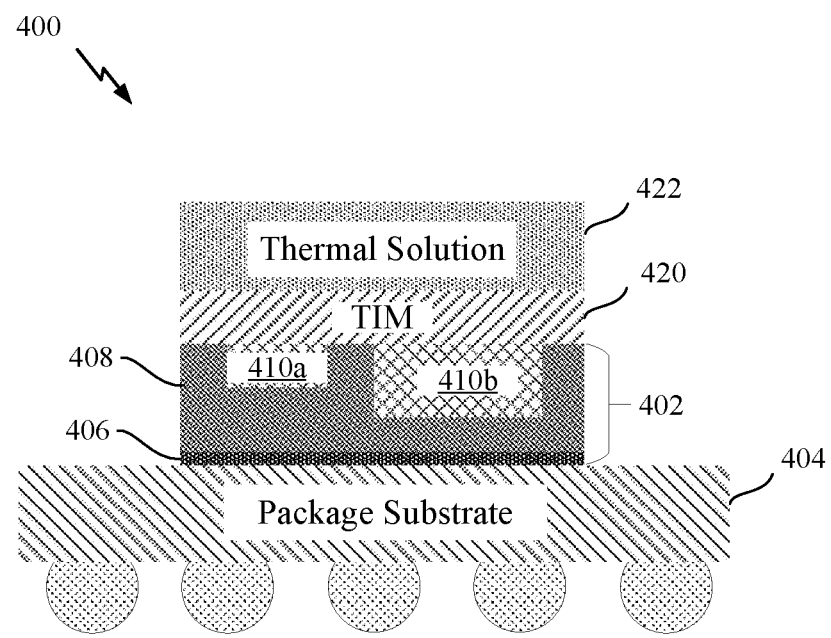
FIG. 4 is a diagram illustrating a cross-sectional view of a semiconductor device included in an IC package, in accordance with aspects of the present disclosure.

In accordance with some aspects of the present disclosure, the resulting device may then be included in a substrate package such as is shown, for example, in FIG. 4. The package can be a substrate system-in-package (SiP) or package-on-package (PoP), for example, using any suitable packaging technology.

FIG. 4 is a diagram illustrating a cross-sectional view of a semiconductor device included in an IC package 400, in accordance with aspects of the present disclosure. Referring to FIG. 4, a semiconductor device 402 may be placed on a package substrate 404, such that an active side 406 of the semiconductor device 402 may be in contact with an upper surface of the package substrate 404. As described above, in relation to FIGS. 1-3, the semiconductor device 402 may have one or more trenches (e.g., 410a, 410b) formed on a back side 408 of the semiconductor device 402. The position and size of the trench(es) (e.g., 410a, 410b) may be determined based on a type of heat generating element or temperature profile of elements included on the active side 406 of the semiconductor device 402. The trench(es) (e.g., 410a, 410b) may be filled or plated with a thermally conductive material to form plated trench(es) having a greater heat dissipation coefficient than the substrate of the semiconductor device 402. For instance, where the substrate of the semiconductor device 402 is silicon (Si), the trench(es) (e.g., 410a, 410b) may be filled with copper (Cu) or silver (Ag), both of which are more thermally conductive than silicon (Si).

A thermal interface material (TIM) 420 may be applied to the surface of the back side 408 of the semiconductor device 402. The thermal interface material 420 may be a thermal paste, thermal sponge, or thermal bonding material, for instance. The thermal interface material 420 may couple the semiconductor device 402 to a thermal solution 422. The thermal solution 422 may, for example, be a heat sink or other solution for dissipating heat generated via the heat generating logic devices on the active side 406 of the semiconductor device 402.

This arrangement is useful because when the logic device (e.g., on the active side 406 of the semiconductor device 402) is active or powered, the logic device operating at a certain frequency generates power dissipated in the form of heat. Some of the heat dissipates downwardly (e.g., through the package substrate 404) and some of the heat dissipates upwardly of the active side 406 of the semiconductor device 402 through the trench(es) (410a, 410b) and eventually via the thermal solution into the atmosphere above the IC package 400.

Figure 5:
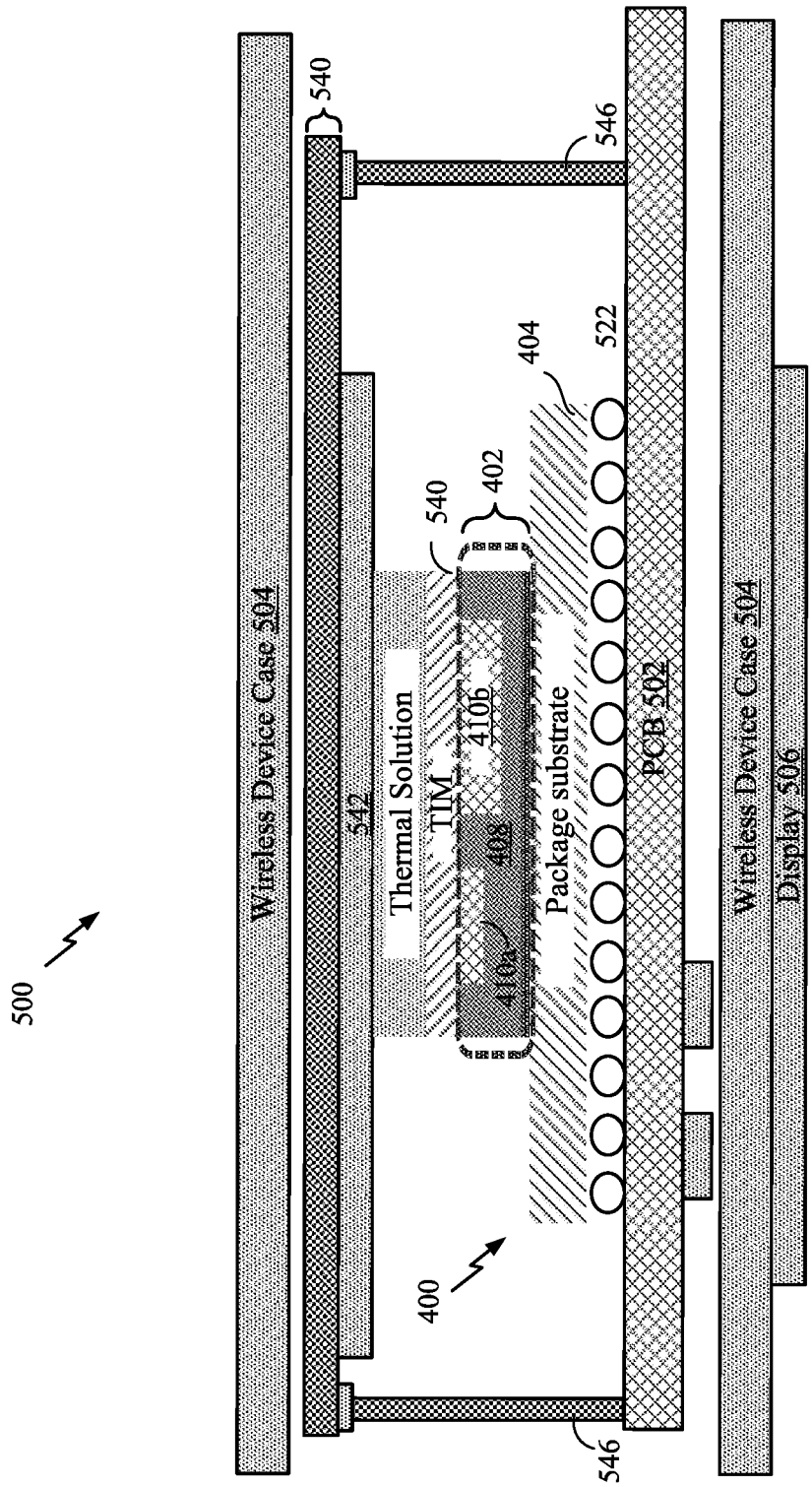
FIG. 5 shows a cross-sectional view illustrating the stacked IC package of FIG. 4, incorporated into a wireless device, according to one aspect of the present disclosure.

FIG. 5 shows a cross-sectional view illustrating the stacked IC package 400 of FIG. 4, incorporated into a wireless device 500, according to one aspect of the present disclosure. As described, the wireless device 500 may be, but is not limited to, a smartphone, tablet, handheld device, or other electronic device with limited form factor. Representatively, the stacked IC package 400 may be mounted on a printed circuit board 502 via interconnects 522 and arranged within a wireless device case 504, including a display 506. In this configuration, a thermal interface material (e.g., a thermal interface material (TIM) sponge) 540 connects a thermal solution, such as a heat spreader 542, for example, to the stacked IC package 400. In some aspects, the wireless device 500 may also include conductive support pillars 546.

In one configuration, the wireless device 500 includes means for thermal management that is disposed on a back side 408 of a die opposite a heat generating device. In one aspect, the means for thermal management may be the trench plated with a thermally conductive material (e.g., 106a, 106b/202a-202e/410a, 410b of FIGS. 1-5), for example, configured to perform the functions recited by the thermal management means. In another aspect, the aforementioned means may be any device or any layer configured to perform the functions recited by the aforementioned means.

Figure 6:
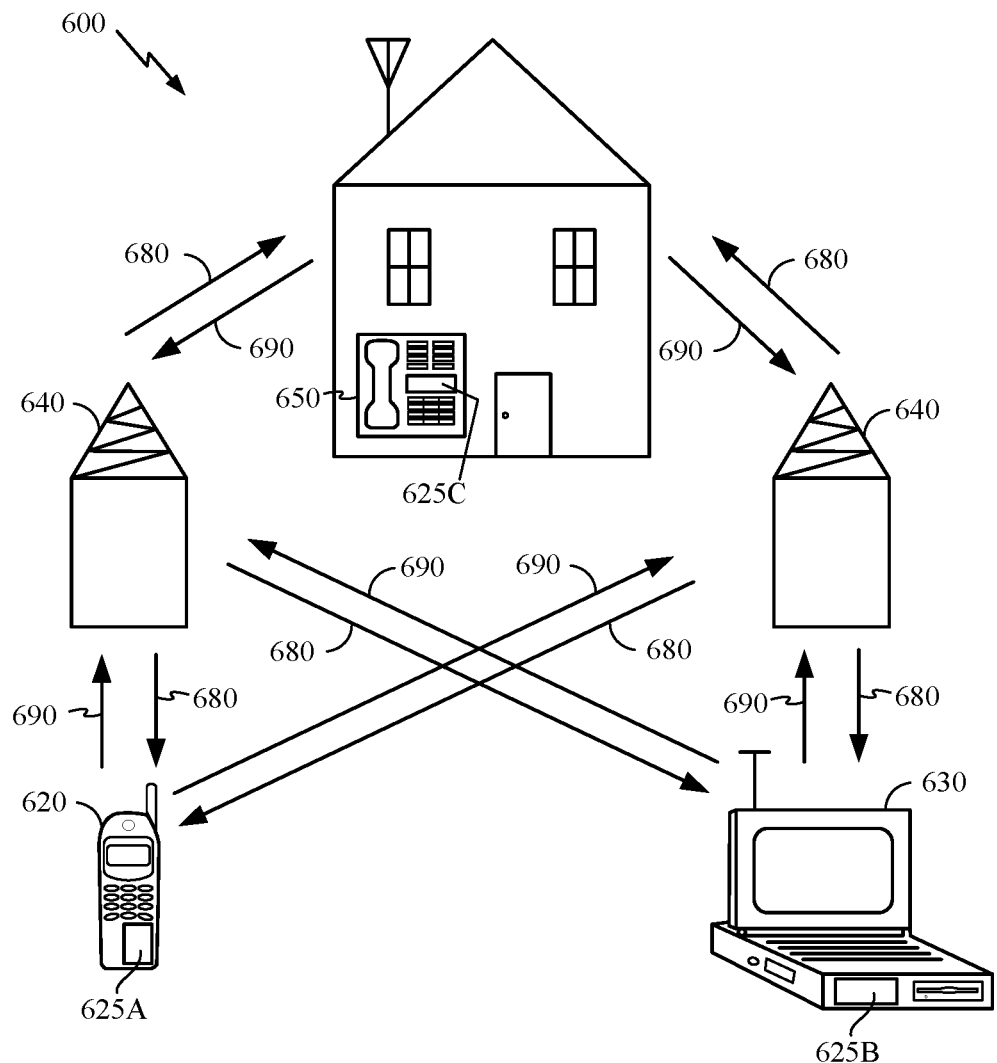
FIG. 6 is a block diagram showing an exemplary wireless communications system in which an aspect of the present disclosure may be advantageously employed.

FIG. 6 is a block diagram showing an exemplary wireless communications system 600, in which an aspect of the present disclosure may be advantageously employed. For purposes of illustration, FIG. 6 shows three remote units 620, 630, and 650, and two base stations 640. It will be recognized that wireless communications systems may have many more remote units and base stations. Remote units 620, 630, and 650 include semiconductor devices 625A, 625B, and 625C, that include one or more trenches filled or plated with a thermally conductive material with a greater heat dissipation coefficient than the substrate on the back side of the device (625A, 625B, or 625C). It will be recognized that any device containing a semiconductor device may also include the plated trench(es) as described in FIGS. 1-5, including the base stations, switching devices, and network equipment. FIG. 6 shows forward link signals 680 from the base stations 640 to the remote units 620, 630, and 650, and reverse link signals 690 from the remote units 620, 630, and 650 to the base stations 640.

In FIG. 6, remote unit 620 is shown as a mobile telephone, remote unit 630 is shown as a portable computer, and remote unit 650 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 6 illustrates remote units according to the teachings of the disclosure, the disclosure is not limited to these exemplary illustrated units. Aspects of the present disclosure may be suitably employed in any device which includes the disclosed heat management.

Figure 7:
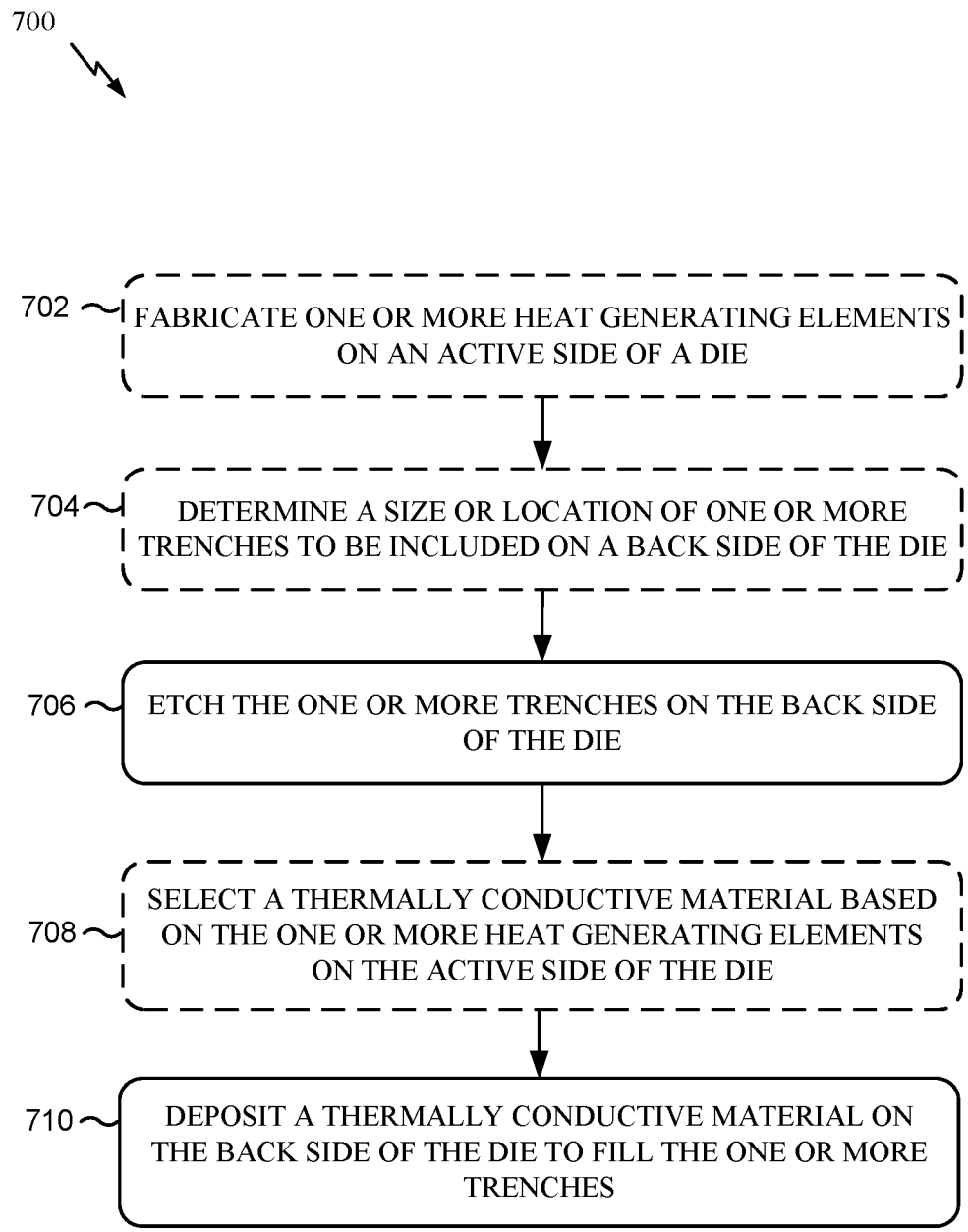
FIG. 7 is a block diagram illustrating a method for fabricating a semiconductor device, in accordance with aspects of the present disclosure.

FIG. 7 is a flow diagram 700 illustrating a process for fabricating a semiconductor device, in accordance with aspects of the present disclosure. Referring to FIG. 7, the process may, at block 702, optionally fabricate one or more heat generating elements on an active side of a die. The heat generating elements may include logic devices such as a CPU or GPU, for example. The logic devices may be fabricated via FEOL processing with interconnections between such logic devices being produced via BEOL processing. For instance, as shown in FIG. 3, at block 302, FEOL and BEOL processes are conducted to fabricate the transistors and other logic devices, as well as interconnections on the active side 102 of the device.

At block 704, the process optionally determines a size or location of one or more trenches to be included on a back side of the die. In some aspects, the one or more trenches may be etched opposite one or more heat generating elements included on the active side of the die.

At block 706, one or more trenches may be etched on the back side of the die. In some aspects, the one or more trenches may be etched on the back side using a plasma etch process or a chemical etch process, for example. As shown in FIG. 3, at block 304, one or more trenches (e.g., 106a and 106b) are produced on the back side of the device. The trench(es) may be produced by applying an etch process such as plasma etching or other process to the back side of the device, for instance. The location of the trench(es) may be determined based on the heat generating elements on the active side of the device. In one example, the trench may be positioned at a corresponding position opposite a heat generating element on the active side of the device.

At block 708, the process optionally selects a thermally conductive material based on one or more heat generating elements on the active side of the die. For example, where the heat generating element is a CPU or GPU, the thermally conductive material may be a metal such as copper (Cu) or silver (Ag) and, where the heat generating element is a multimedia logic element, the thermally conductive material may be a metal alloy.

At block 710, a thermally conductive material may be deposited on the back side of the die to fill one or more trenches forming one or more plated trenches. The thermally conductive material has a greater heat dissipation coefficient than a substrate of the die. As shown in FIG. 3, at block 308, a thermally conductive material 322 may be layered over a seed layer 320 to plate or fill the trench(es) forming plated trenches (e.g., 106a and 106b). The thermally conductive material may have a greater heat dissipation coefficient than that of the substrate of the device. For example, the thermally conductive material may be a metal such as copper (Cu), silver (Ag), or a metal alloy. Additionally, in some aspects, the thermally conductive material may be determined or selected based on heat generating elements on the active side of the device or the temperature profile. In one example, where the heat generating element is a GPU, copper (Cu) may be selected as the thermally conductive material, and where the logic element is a multimedia device, a metal alloy may be selected or used as the thermally conductive material.

For a firmware and/or software implementation of the design/fabrication process, the methodologies may be implemented with modules (e.g., procedures, functions, and so on) that perform the functions described. Any machine-readable medium tangibly embodying instructions may be used in implementing the methodologies described. For example, software codes may be stored in a memory and executed by a processor unit. Memory may be implemented within the processor unit or external to the processor unit. As used the term "memory" refers to any type of long term, short term, volatile, nonvolatile, or other memory and is not to be limited to any particular type of memory or number of memories, or type of media upon which memory is stored.

Although the present disclosure and its advantages have been described in detail, it should be understood that various changes, substitutions, and alterations can be made without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described may be utilized according to the present disclosure. Accordingly, the appended claims are intended to include within their scope such processes, machines, manufacture, compositions of matter, means, methods, or steps.

What is claimed is:

1. A semiconductor device comprising:
    a die having an active side including a heat generating element on the active side, and a trench on a back side of the die, the trench positioned at a corresponding location of the back side opposite to the heat generating element;
    a layer of thermally conductive material on the back side of the die that fills the trench to form a plated trench at a location corresponding to at least a portion of the heat generating element on the active side of the die, the thermally conductive material having a first heat dissipation coefficient; and
    a substrate of the die having a second heat dissipation coefficient, the first heat dissipation coefficient being greater than the second heat dissipation coefficient.

2. The semiconductor device of claim 1, in which the heat generating element comprises a logic element.

3. The semiconductor device of claim 1, in which a surface area or thickness of the plated trench is determined based on a temperature profile of one or more heat generating elements included on the active side of the die.

4. The semiconductor device of claim 1, in which the thermally conductive material is a metal or a metal alloy.

5. The semiconductor device of claim 1, in which the thermally conductive material is copper (Cu) or silver (Ag).

6. The semiconductor device of claim 1, in which the thermally conductive material is selected based on the heat generating element included on the active side of the die.

7. An apparatus, comprising:
    an integrated circuit package including:
        a package substrate; and
        a die mounted on the package substrate, the die having:
            an active side including a heat generating element on an active side of the die;
            a back side including a trench on the back side of the die, the trench positioned at a corresponding location of the back side opposite to the heat generating element, in which a thermally conductive material fills the trench to form a plated trench at a location corresponding to at least a portion of the heat generating element on the active side of the die, the thermally conductive material having a first heat dissipation coefficient; and
            a substrate having a second heat dissipation coefficient, the first heat dissipation coefficient being greater than the second heat dissipation coefficient.

8. The apparatus of claim 7, in which the heat generating element comprises a logic element.

9. The apparatus of claim 7, in which a surface area or thickness of the plated trench is determined based on a temperature profile of the heat generating element included on the active side of the die.

10. The apparatus of claim 7, in which the thermally conductive material is a metal or a metal alloy.

11. The apparatus of claim 7, in which the thermally conductive material is copper (Cu) or silver (Ag).

12. The apparatus of claim 7, in which the thermally conductive material is selected based on the heat generating element included on the active side of the die.

13. The apparatus of claim 7, further comprising a thermal solution coupled to the back side of the die to further dissipate heat generated by the heat generating element on the active side of the die.

14. The apparatus of claim 7, incorporated into at least one of a smartphone, a music player, a video player, an entertainment unit, a navigation device, a communications device, a personal digital assistant (PDA), a fixed location data unit, or a computer.

* * * * *